United States Patent
Vaswani et al.

(10) Patent No.: US 12,155,354 B2
(45) Date of Patent: Nov. 26, 2024

(54) POWER TRANSISTOR DEVICES AND AMPLIFIERS WITH INPUT-SIDE HARMONIC TERMINATION CIRCUITS

(71) Applicant: NXP USA, Inc., Austin, TX (US)

(72) Inventors: Jitesh Vaswani, Chandler, AZ (US); Sai Sunil Mangaonkar, Chandler, AZ (US); Aniket Anant Wadodkar, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 486 days.

(21) Appl. No.: 17/646,703

(22) Filed: Dec. 31, 2021

(65) Prior Publication Data

US 2023/0216452 A1 Jul. 6, 2023

(51) Int. Cl.
*H03F 3/191* (2006.01)
*H03F 1/56* (2006.01)
*H03F 3/19* (2006.01)

(52) U.S. Cl.
CPC .............. *H03F 1/565* (2013.01); *H03F 3/19* (2013.01); *H03F 2200/222* (2013.01); *H03F 2200/451* (2013.01)

(58) Field of Classification Search
CPC ....................................................... H03F 3/191
USPC ................................................. 330/302, 305
See application file for complete search history.

(56) References Cited

U.S. PATENT DOCUMENTS

| | | | |
|---|---|---|---|
| 10,587,226 B2 | 3/2020 | Ahmed et al. | |
| 10,742,174 B2 | 8/2020 | Roberts et al. | |
| 11,552,597 B2* | 1/2023 | Wilson | H03F 1/3241 |
| 2004/0041634 A1 | 3/2004 | Sugiura | |
| 2012/0218040 A1 | 8/2012 | Takagi et al. | |
| 2021/0175866 A1 | 6/2021 | Li et al. | |
| 2022/0140794 A1* | 5/2022 | Brewer | H03F 3/195 |
| | | | 330/295 |
| 2023/0116432 A1* | 4/2023 | Joshi | H03F 1/56 |
| | | | 330/291 |

FOREIGN PATENT DOCUMENTS

JP 2015195449 A 11/2015

* cited by examiner

*Primary Examiner* — Henry Choe
(74) *Attorney, Agent, or Firm* — Sherry Gourlay

(57) ABSTRACT

An RF amplifier includes an amplifier input, a transistor die with a transistor and a transistor input terminal, a fundamental frequency impedance matching circuit coupled between the amplifier input and the transistor input terminal, and a harmonic frequency termination circuit coupled between the transistor input terminal and a ground reference node. The harmonic frequency termination circuit includes a first inductance coupled between the transistor input terminal and a first node, and a tank circuit coupled between the first node and the ground reference node. The tank circuit includes a first capacitance coupled between the first node and the ground reference node, and a second inductance coupled between the first node and the ground reference node. The tank circuit is configured to shunt signal energy at or near a second harmonic frequency, while appearing as an open circuit to signal energy at a fundamental frequency of operation of the RF amplifier.

19 Claims, 6 Drawing Sheets

POWER TRANSISTOR DEVICES AND AMPLIFIERS WITH INPUT-SIDE HARMONIC TERMINATION CIRCUITS

TECHNICAL FIELD

Embodiments of the subject matter described herein relate generally to radio frequency (RF) amplifiers, and more particularly to power transistor devices and amplifiers with harmonic frequency termination circuits.

BACKGROUND

Wireless communication systems employ power amplifiers for increasing the power of radio frequency (RF) signals. Input impedance matching circuits are commonly implemented at the input of a power amplifier to enable best performance. In an amplifier that includes a power transistor device characterized by nonlinear input capacitance, the power transistor may generate significant undesirable signal energy at harmonics of the fundamental frequency of operation of the amplifier, and particularly at a second harmonic frequency. This undesirable second harmonic frequency signal energy may limit the achievable performance of the amplifier. Accordingly, a second harmonic termination circuit may play an important role in the overall performance of a power amplifier design that includes a power transistor device with nonlinear input capacitance. However, conventional second harmonic termination circuits may undesirably interact with an input impedance matching circuit, which may degrade amplifier performance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
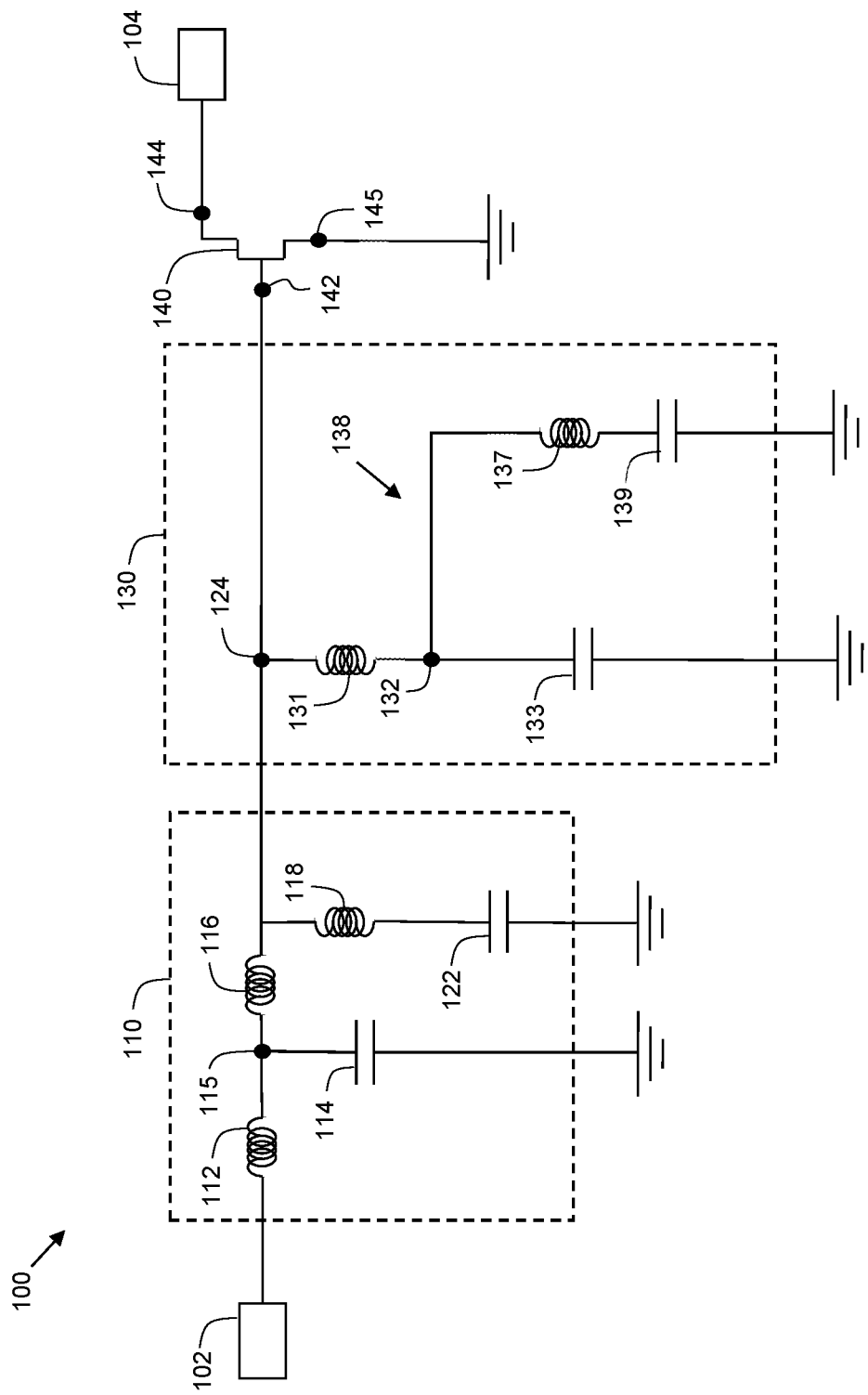
FIG. 1 is a schematic circuit diagram of a power amplifier circuit, in accordance with an example embodiment.

As mentioned above, in an amplifier that includes a power transistor device characterized by nonlinear input capacitance (e.g., a gallium nitride (GaN) transistor), the power transistor may generate significant undesirable signal energy at harmonics of the fundamental frequency of operation of the amplifier, and particularly at a second harmonic frequency. Accordingly, a second harmonic frequency termination circuit ("harmonic termination circuit") may be included at the input of such an amplifier.

A typical harmonic termination circuit includes a series-coupled inductor-capacitor (LC) circuit connected between the input (e.g., gate) of a power transistor device and a ground reference node (i.e., the harmonic termination circuit is connected in a shunt configuration). The series LC harmonic termination circuit is essentially configured to resonate at or near the second harmonic frequency, in order to shunt signal energy at the second harmonic frequency to ground. Some fundamental match circuits include a shunt inductance, which may be implemented using a set of bondwires. The inductance of the LC harmonic termination circuit also may be implemented using a set of bondwires, and when a higher capacitance value is utilized in the LC harmonic termination circuit, the bondwire inductances of the fundamental match and the harmonic termination circuit may undesirably interact and degrade amplifier performance (e.g., by changing the network resonance of the fundamental match circuitry, thus negatively impacting the amplifier gain).

For a power transistor device that is configured to operate at a relatively low fundamental frequency of operation (e.g., below 1 gigahertz (GHz)), the capacitance value of a harmonic termination circuit that is needed to create an effective second harmonic termination is fairly high, when compared with capacitance values that may be utilized in amplifiers that operate at higher frequencies. However, the relatively high capacitance value utilized in a harmonic termination circuit in a lower frequency amplifier may produce undesirable interactions between the inductance of the harmonic termination circuit and the fundamental match circuitry. More particularly, such a harmonic termination circuit may create a higher high-pass cutoff, meaning that the effective inductance for the high pass resonance may be reduced, which in turn may degrade the amplifier gain. In other words, for an amplifier designed to operate at a relatively low fundamental frequency of operation, a typical harmonic termination circuit may not be sufficiently transparent to the fundamental matching circuitry, and may undesirably load the fundamental matching circuitry.

According to various embodiments of the inventive subject matter, a power amplifier circuit is provided, which includes harmonic termination circuitry that does not exhibit the undesirable effects described above. More particularly, embodiments of harmonic termination circuits discussed herein are configured to avoid interfering with the fundamental match circuitry, even in amplifiers that operate at relatively low fundamental frequencies. As will be described in detail below, embodiments of harmonic termination circuits described herein are configured to shunt signal energy at or near the second harmonic frequency, while appearing as an open circuit to signal energy at the fundamental frequency. Accordingly, during operation, the harmonic termination circuit may substantially avoid the above-mentioned undesirable interactions between the inductance of the harmonic termination circuit and the fundamental match circuitry, an thus may avoid the undesirable performance degradation associated with such interactions.

FIG. 1 is a schematic diagram of an RF power amplifier circuit 100. Circuit 100 includes an input 102, an input fundamental frequency impedance matching circuit 110 ("fundamental match circuit"), a second harmonic frequency termination circuit 130 ("harmonic termination circuit"), a transistor 140, and an output lead 104, in an embodiment. Each of the input and output 102, 104 may be more generally referred to as an "RF input/output (I/O)." Further, reference is made below to a "ground reference node." In various embodiments, a "ground reference node" is a conductive feature of a device or module (e.g. a flange 301, FIG. 3, a die pad, or a conductive ground plane in a printed circuit board (PCB) based module) to which terminals of various components of the circuit 100 are coupled, where that conductive feature may be coupled to system ground (e.g., to a zero volt ground reference or to another voltage reference) when the device or module is incorporated into a larger electrical system.

Input 102 and output 104 each may include a conductor (e.g., a package lead), which is configured to enable the circuit 100 to be electrically coupled with external circuitry (not shown). More specifically, the input and output 102, 104 are physically positioned to span between the exterior and the interior of a device package or module, in an embodiment. Fundamental match circuit 110 and harmonic termination circuit 130 are electrically coupled between the input 102 and an input terminal 142 of transistor 140 (also referred to as a "transistor input terminal", a "control terminal" or a "gate terminal"). A first current-carrying terminal 144 of transistor 140 (e.g., the drain terminal) is either directly or indirectly (e.g., through an output impedance matching circuit, not shown) coupled to the output 104. A second current-carrying terminal 145 of transistor 140 (e.g., the source terminal) is coupled to a ground reference node.

According to an embodiment, transistor 140 is the primary active component of circuit 100. Transistor 140 includes a control terminal 142 and two current-carrying terminals 144, 145, where the current-carrying terminals 144, 145 are spatially and electrically separated by a variable-conductivity channel. For example, transistor 140 may be a field effect transistor (FET), which includes a gate terminal (control terminal 142), a drain terminal (a first current-carrying terminal 144), and a source terminal (a second current-carrying terminal 145). According to an embodiment, and using nomenclature typically applied to FETs in a non-limiting manner, the gate terminal 142 of transistor 140 is coupled to the fundamental match circuit 110 and the harmonic termination circuit 130, the drain terminal 144 of transistor 140 is coupled to the output 104, and the source terminal 145 of transistor 140 is coupled to ground (or another voltage reference). Through the variation of control signals provided to the gate terminal of transistor 140, the current between the current-carrying terminals of transistor 140 may be modulated.

According to various embodiments, transistor 140 is a III-V field effect transistor (e.g., a high electron mobility transistor (HEMT)), which has a nonlinear input capacitance and a relatively low drain terminal-source terminal capacitance, Cds, when compared with a silicon-based FET (e.g., a laterally-diffused metal oxide semiconductor (LDMOS) FET). According to an embodiment, transistor 140 may have a drain terminal-source terminal capacitance that is less than about 0.2 pF/W. Further, in some embodiments, transistor 140 may be a GaN FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a nonlinear input capacitance and a relatively low drain terminal-source terminal capacitance.

As mentioned above, the fundamental match circuit 110 and harmonic termination circuit 130 are electrically coupled between the input 102 and a first terminal 142 of transistor 140 (e.g., the gate terminal). More specifically, the fundamental match circuit 110 is coupled between input 102 and a second node 124, which in turn is coupled to the control terminal 142 (e.g., gate terminal) of the transistor 140. Fundamental match circuit 110 is configured to transform (e.g., raise) the gate impedance of transistor 140 to a higher (e.g., intermediate or higher) impedance level (e.g., in a range from about 2 to about 10 ohms or higher) at node 102.

According to an embodiment, fundamental match circuit 110 has a bandpass filter topology, which includes a single T-match circuit and a shunt inductance (in series with a DC blocking capacitor). More specifically, and according to the illustrated embodiment, the fundamental match circuit 110 includes a T-match circuit composed of a first inductive element 112 (e.g., a first set of bondwires 312, FIG. 3) coupled between input 102 and a first node 115 (also referred to as a "connection node"), a shunt capacitance 114 coupled between node 115 and a ground reference node, and a second inductive element 116 (e.g., a second set of bondwires 316, FIG. 3) coupled between node 115 and a second node 124, which in turn is coupled to the control terminal 142 of transistor 140. The shunt inductance is composed of an inductive element 118 (e.g., a third set of bondwires 318, FIG. 3) coupled in series with a capacitance 122 (e.g., a DC blocking capacitor), where the series inductance and capacitance is coupled between the second node 124 (or the control terminal 142 of transistor 140) and a ground reference node. According to an embodiment, inductive elements 112, 116 and shunt capacitance 114 form a low-pass filter portion of a bandpass-like filter configuration, and shunt inductive element 118 forms a high pass filter portion of the bandpass-like filter configuration. This bandpass-like configuration allows for wideband operation at RF frequencies that would not be as easily achieved with simpler matching networks.

According to an embodiment, inductive element 112 may have an inductance value in a range between about 150 picohenries (pH) to about 400 pH, inductive element 116 may have an inductance value in a range between about 80 pH to about 600 pH, shunt inductance 118 may have an inductance value in a range between about 100 pH to about 350 pH, and shunt capacitance 114 may have a capacitance value in a range between about 6 picofarads (pF) to about 60 pF. DC blocking capacitor 122 may have a capacitance value in a range between about 60 pF to about 240 pF for high-power applications. In other embodiments, some or all of the above-listed components may have smaller or larger component values than the above-given ranges.

According to an embodiment, harmonic termination circuit 130 is coupled between the second node 124 (or the input terminal 142 (e.g., gate terminal) of transistor 140) and a ground reference node. Accordingly, the second node 124 basically corresponds to an input to harmonic termination circuit 130. Harmonic termination circuit 130 essentially includes an inductance 131 (e.g., a fourth set of bondwires 331, FIG. 3) coupled between the second node 124 (or the input terminal 142 of the transistor 140) and a third node 132, and a tank circuit 138 coupled between the third node 132 and a ground reference node. The tank circuit 138 essentially is composed of an inductance 137 in parallel with a capacitance 133, where the parallel combination is coupled between the third node 132 and the ground reference node. A DC blocking capacitor 139 may be coupled in series with inductance 137, according to an embodiment. Said another way, harmonic termination circuit 130 includes inductance 131 coupled in series with a parallel LC tank circuit (i.e., inductance 137/DC blocking capacitor 139 in parallel with capacitance 133).

Figure 2:
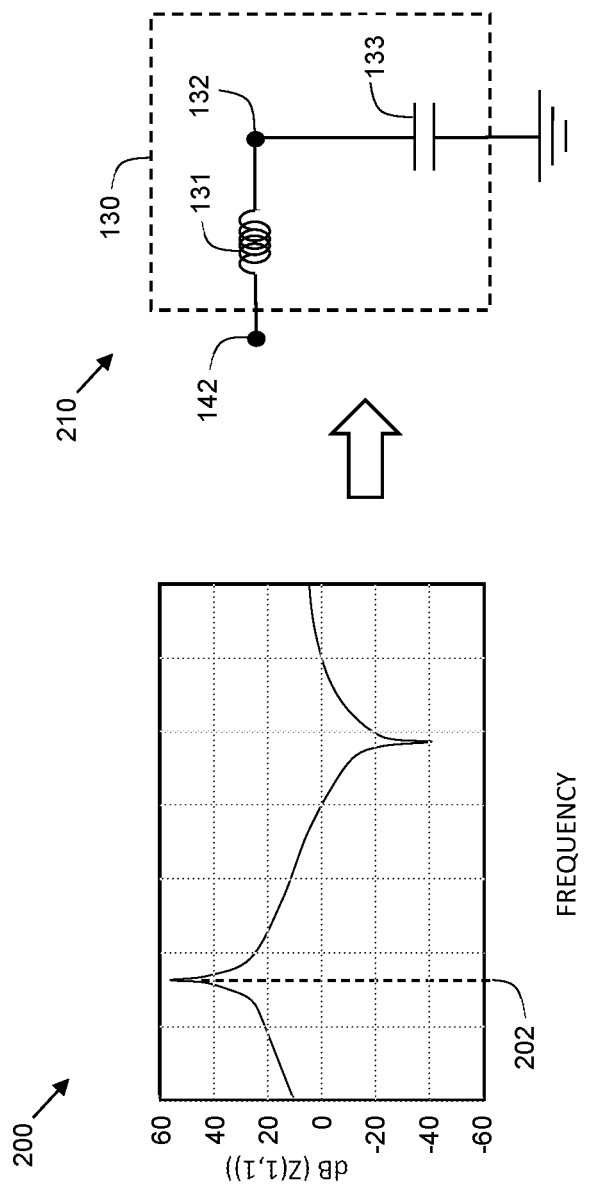
FIG. 2 includes a chart illustrating an impedance profile of an embodiment of a harmonic frequency termination circuit over a range of frequencies, along with an associated equivalent circuit of the harmonic frequency termination circuit at frequencies significantly above a fundamental frequency of operation.

According to an embodiment, the inductance and capacitance values selected for the tank circuit 138 configure the circuit 138 to function as a high impedance path to ground (e.g., effectively an open circuit) for signal energy at the fundamental frequency of operation, and a low impedance path to ground for signal energy at or near a second harmonic frequency (e.g., at the second harmonic frequency or within 10 percent of the second harmonic frequency). More specifically, and referring briefly to FIG. 2, chart 200 illustrates an impedance profile of tank circuit 138 over a range of frequencies. In chart 200, frequency 202 corresponds, at least approximately (e.g., within 5 percent), to the fundamental frequency of operation of amplifier 100. At the fundamental frequency 202, the impedance of tank circuit 138 reaches a peak, thus essentially presenting itself as an open circuit to nodes 124, 132 and the input terminal 142 of transistor 140 for signal energy at the fundamental frequency. At frequencies below the fundamental frequency 202, the inductance 137 of tank circuit 138 dominates, and at frequencies above the fundamental frequency 202, as indicated in the simplified circuit 210 to the right of chart 200, the capacitance 133 of tank circuit 138 dominates, and a series LC circuit is formed from inductance 131 and capacitance 133.

According to an embodiment, the values for the parallel inductance 137 and capacitance 133 of tank circuit 138 are selected so that, at the fundamental frequency of operation, the inductance 137 and capacitance 133 create a parallel resonance with a very high impedance (e.g., approximating an open circuit). At higher frequencies, inductance 137 presents a very high impedance, and the capacitance 133 of the tank circuit 138 becomes more dominant, while the inductance 137 becomes less dominant. According to an embodiment, at or near the second harmonic frequency, the electrical equivalent of the harmonic termination circuit 130 essentially includes a series LC circuit comprised of the inductance 131 (the "L" of the series LC circuit), and the capacitance 133 of the tank circuit 138 (the "C" of the series LC circuit). The values for the inductance 131 and capacitance 133 of this effective series LC circuit are selected to resonate at or near the second harmonic frequency. The value of 131 can be chosen to terminate the signal energy at an optimum location at or near the second harmonic frequency. Accordingly, for signal energy at or near the second harmonic frequency, harmonic termination circuit 130 presents itself as a low-impedance path to ground.

According to an embodiment, the inductance 131 has an inductance value in a range of about 200 pH to about 500 pH, inductance 137 has an inductance value in a range of about 200 pH to about 1000 pH, and capacitance 133 has a capacitance value in a range of about 10 pF to about 50 pF. DC blocking capacitor 139 may have a capacitance value in a range between about 60 pF to about 250 pF for high-power applications. In other embodiments, the various components of harmonic termination circuit 130 may have lower or higher values than those specified in the above-given ranges.

Because the tank circuit 138 essentially presents itself as an open circuit to signal energy at the fundamental frequency, insignificant or negligible fundamental frequency current components flow through inductances 131 and 137 during operation of the amplifier 100. Accordingly, when either or both of the inductances 131, 137 of the harmonic termination circuit 130 are implemented using bondwires, those bondwire inductances 131, 137 are not likely to interact significantly (e.g., through mutual coupling) with inductances 118, 116 of the fundamental match circuit 110, which also may be implemented as bondwires. Accordingly, utilization of the tank circuit 138 in the harmonic termination circuit 130 may avoid significantly changing the network resonance of the fundamental match circuitry 110, thus avoiding negative impacts to the amplifier gain.

Although transistor 140 and various elements of the fundamental match circuit 110 and the harmonic termination circuit 130 are shown as singular components, the depiction is for the purpose of ease of explanation only. Those of skill in the art would understand, based on the description herein, that transistor 140 and/or certain elements of the fundamental match circuit 110 and the harmonic termination circuit 130 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The specific description of transistor 140 and various elements of the fundamental match circuit 110 and the harmonic termination circuit 130 thus are not intended to limit the scope of the inventive subject matter only to the illustrated embodiments.

Referring again to FIG. 1, and as will be described in more detail later in conjunction with FIGS. 3 and 4, various embodiments of RF amplifier devices may include at least one input-side integrated passive devices (IPDs) (e.g., IPDs 310, 330, 430, FIGS. 3, 4) configured to implement portions of the fundamental match circuit 110 and the harmonic termination circuit 130. More specifically, each IPD may include a semiconductor substrate with one or more integrated passive components. In a particular embodiment, the input-side IPD(s) may include shunt capacitances 114, 122, 133, and 139 (FIG. 1).

In other embodiments, some portions of the fundamental match circuit 110 and/or harmonic termination circuit 130 may be implemented as distinct/discrete components or as portions of other types of assemblies (e.g., a low-temperature co-fired ceramic (LTCC) device, a small PCB assembly, and so on). In still other embodiments, some portions of the fundamental match circuit 110 and/or harmonic termination circuit 130 may be coupled to and/or integrated within the semiconductor die that includes transistor 140. The below, detailed description of embodiments that include IPDs should not be taken to limit the inventive subject matter, and the term "passive device substrate" or "IPD substrate" means any type of structure that includes a passive device, including an IPD, a LTCC device, a transistor die, a PCB assembly, and so on.

Amplifier 100 may be implemented in a discrete, packaged power amplifier device, in some embodiments, or in a PCB-based module, in other embodiments. In such devices, input and output leads are coupled to a support substrate, and components associated with the amplifier 100 also are coupled to the substrate. A power amplifier die housing transistor 140, along with the fundamental match circuit 110 and harmonic termination circuit 130, are included as some of these components within the packaged device or module.

Figure 3:
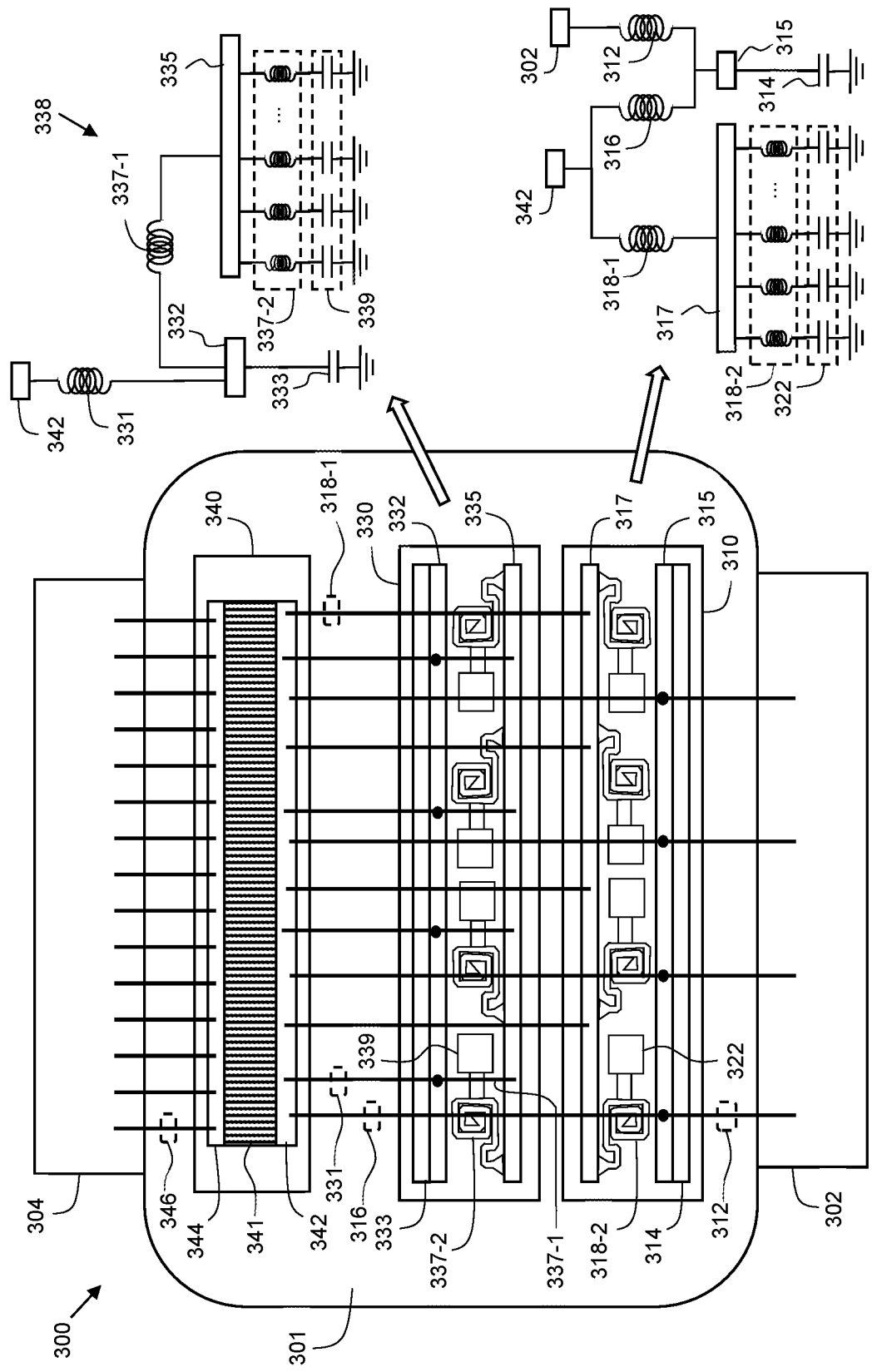
FIG. 3 is a top view of a packaged RF power amplifier device that embodies the power amplifier circuit of FIG. 1, in accordance with an example embodiment.
Figure 4:
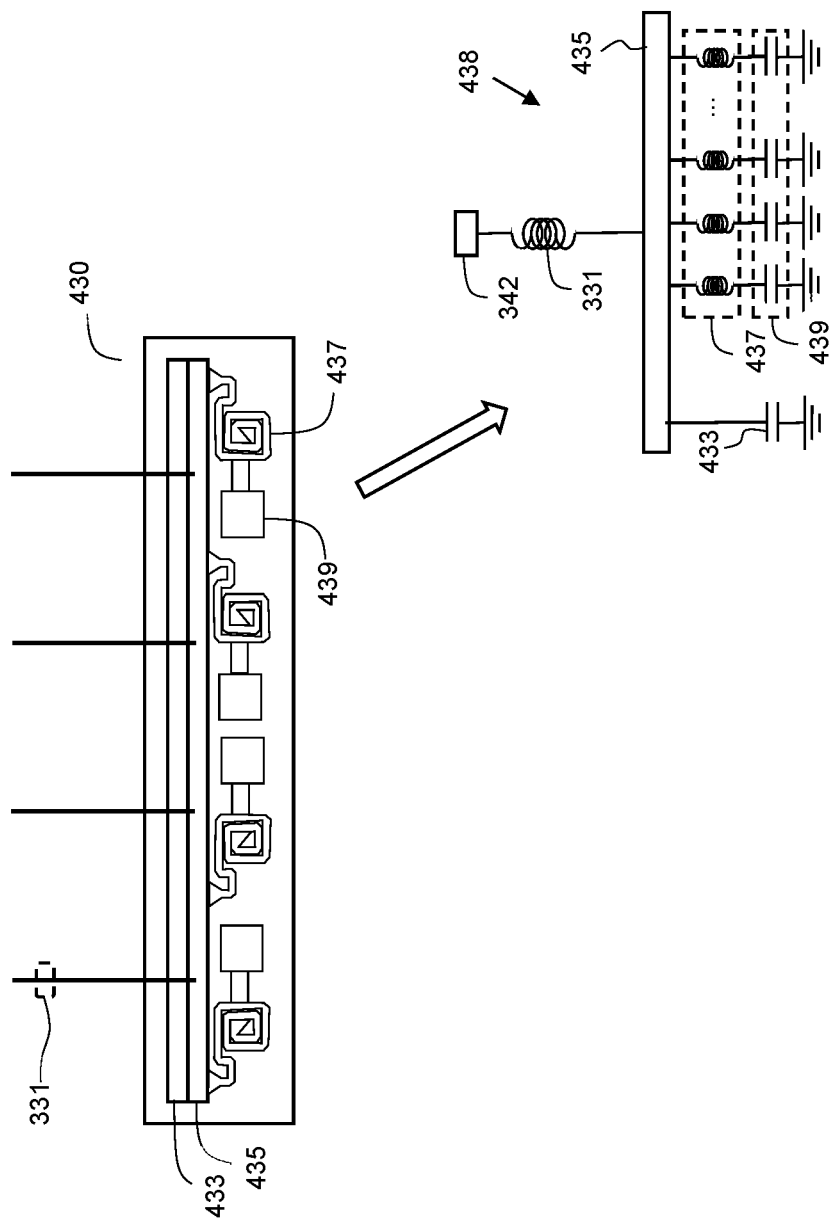
FIG. 4 is a top view of an integrated passive device that embodies a harmonic frequency termination circuit, in accordance with an embodiment.

For example, FIG. 3 is a top view of an embodiment of a packaged RF amplifier device 300 that embodies amplifier 100 of FIG. 1. As will be described in more detail below, device 300 includes a power transistor die 340 and two input-side IPDs 310, 330, each of which includes portions of a fundamental match circuit (e.g., circuit 110, FIG. 1) or a harmonic termination circuit (e.g., circuit 130, FIG. 1).

Device 300 includes a flange 301 (or "device substrate"), in an embodiment, which may include a rigid electrically- and thermally-conductive substrate with a thickness that is sufficient to provide structural support for various electrical components and elements of device 300. Flange 301 has top and bottom surfaces, where the top surface is visible in FIG. 3. According to an embodiment, flange 301 may function as a heat sink for transistor die 340. Further, flange 301 may correspond to a ground reference node for the device 300 (and more particularly for transistor die 340 and IPDs 310, 330). For example, various components and elements may have terminals that are electrically coupled to flange 301, and flange 301 may be electrically coupled to a system ground when the device 300 is incorporated into a larger electrical system. At least the top surface of flange 301 is formed from a layer of conductive material, and possibly all of flange 301 is formed from bulk conductive material.

Although not shown in FIG. 3, an isolation structure may be attached to the top surface of flange 301, in an embodiment. The isolation structure, which is formed from a rigid, electrically insulating material, provides electrical isolation between conductive features of the device (e.g., between leads 302, 304 and flange 301). The isolation structure may have a frame shape, in an embodiment, which includes a substantially enclosed, four-sided structure with a central opening. Alternatively, the isolation structure may have another shape (e.g., annular ring, oval, and so on).

A portion of the top surface of flange 301 that is exposed through the opening in the isolation structure is referred to herein as the "active area" of device 300. Transistor die 340 and IPDs 310, 330 are positioned within the active device area of device 300, and are physically and electrically coupled to the top surface of the flange 301. For example, the transistor die 340 and IPDs 310, 330 may be coupled to the top surface of flange 301 using conductive epoxy, solder, solder bumps, sintering, and/or eutectic bonds.

According to the embodiment illustrated in FIG. 3, device 300 is incorporated in an air cavity package, in which the power transistor die 340 and the IPDs 310, 330 are located within an enclosed air cavity. Basically, the air cavity is bounded by flange 301, the isolation structure (not shown), and a cap (not shown) overlying and in contact with the isolation structure and leads 302, 304. In other embodiments, the components of device 300 may be incorporated into an overmolded package (i.e., a package in which the electrical components within the active area of the device are encapsulated with a non-conductive molding compound, and in which portions of the leads 302, 304 also may be encompassed by the molding compound). In still other embodiments, the components of device 300 may be incorporated into a no-leads package (e.g., a dual flat no-leads (DFN) or quad flat no-leads (QFN) package), or into other types of packages.

Regardless of the type of packaging utilized, device 300 houses a single amplification path that represents a physical implementation of amplifier circuit 100 (FIG. 1). The amplification path embodied in device 300 includes an input lead 302 (e.g., input 102, FIG. 1), an output lead 304 (e.g., output 104, FIG. 1), a power transistor die 340 (e.g., embodying transistor 140, FIG. 1), an input-side impedance matching circuit (e.g., fundamental match circuit 110, FIG. 1), and an input-side harmonic termination circuit (e.g., harmonic termination circuit 130, FIG. 1). Some embodiments also may have an output-side impedance matching circuit and/or an output-side harmonic termination circuit (not illustrated).

The input and output leads 302, 304 may be mounted on a top surface of the isolation structure on opposed sides of the central opening, and thus the input and output leads 302, 304 are elevated above the top surface of the flange 301, and are electrically isolated from the flange 301. Generally, the input and output leads 302, 304 are oriented to allow for attachment of bondwires between the input and output leads 302, 304 and components and elements within the central opening of isolation structure.

The transistor die 340 includes an integrated power transistor 341 (e.g., transistor 140, FIG. 1). The transistor 341 has an input terminal (e.g., input terminal 142, FIG. 1) and two current-carrying terminals (e.g., output/drain terminal 144 and source terminal 145, FIG. 1). As discussed previously in conjunction with FIG. 1, transistor 341 may be a field effect transistor (FET). For example, and according to various embodiments, transistor 341 may be a III-V field effect transistor (e.g., a HEMT) or another type of transistor. In some embodiments, transistor 341 may have a nonlinear input capacitance.

The input terminal of the transistor 341 is coupled to an input bondpad 342 of die 340, the first current-carrying terminal of the transistor 341 (e.g., the output/drain terminal) is coupled to an output bondpad 344 of die 340, and the second current-carrying terminal of the transistor 341 may be coupled to the flange 301 (e.g., using through substrate vias and a conductive layer on the bottom of die 340), and thus to a ground reference node. The output bondpad 344 (and thus the first current-carrying terminal of transistor 341) is electrically coupled to the output lead 304 through a set of bondwires 346.

Note that, in FIG. 3, for convenience of illustration, only one bondwire is circled/referenced for each of the various sets of bondwires discussed herein (e.g., bondwire sets 312, 316, 331, 337-1, 318-1, 346). All bondwires that connect between the same two elements are considered to be within a same set of bondwires. Further, although in FIG. 3 each set of bondwires is shown to include a particular number of bondwires, each set of bondwires may include fewer or more bondwires than is illustrated. Generally, for any particular set of bondwires, the number of bondwires and the bondwire profile/length determine a desired inductance value associated with the set of bondwires.

Referring again to transistor die 340, the input bondpad 342 (and thus the input terminal of transistor 341) is coupled through the fundamental match circuit (e.g., circuit 110, FIG. 1) and the harmonic termination circuit (e.g., circuit 130, FIG. 1) to the input lead 302 (e.g., input 102, FIG. 1). In other words, the fundamental match circuit (e.g., circuit 110, FIG. 1) and harmonic termination circuit (e.g., circuit 130, FIG. 1) are electrically coupled between the input lead 302 (e.g., input 102, FIG. 1) and the input bondpad 342 of transistor die 340 (and thus to the input terminal of transistor 341). To assist with the understandability of FIG. 3, an electrical equivalent of the fundamental match circuit is shown in the lower right corner of FIG. 3, and an electrical equivalent of the harmonic termination circuit is shown in the upper right corner of FIG. 3.

According to the illustrated embodiment, portions of the fundamental match circuit (e.g., circuit 110, FIG. 1) are embodied in a first IPD 310 that is coupled to the top surface of the flange 301 between the input lead 302 and the transistor die 340. More specifically, the portions of the fundamental match circuit embodied within IPD 310 include a first shunt capacitance 314 and a shunt LC network including a series combination of inductance 318-2 and capacitance 322. Other portions of the fundamental match circuit, and in particular other inductive portions, are implemented using bondwires 312, 316, 318-1. Various conductive "nodes" are implemented with bondpads (e.g., bondpads 315, 317).

As discussed previously in conjunction with FIG. 1, according to an embodiment, the fundamental match circuit includes a T-match circuit with a first inductance in the form of a first set of bondwires 312 (e.g., first inductive element 112, FIG. 1) with first ends coupled to input lead (e.g., input 102, FIG. 1) and second ends coupled to bondpad 315 of IPD 310 (e.g., corresponding to node 115, FIG. 1). The T-match circuit further includes a shunt capacitor 314 (e.g., capacitance 114, FIG. 1) with a first terminal coupled to bondpad 315, and a second terminal coupled to a ground reference node (e.g., to flange 301). In addition, the T-match circuit further includes a second inductance in the form of a second set of bondwires 316 (e.g., second inductive element 116, FIG. 1) with first ends coupled to bondpad 315 and second ends coupled to the input bondpad 342 of transistor die 340 (and thus to the input/control terminal of transistor 341).

The fundamental match circuit also includes a shunt inductance, which is composed of a series arrangement of a third set of bondwires 318-1 (e.g., a portion of inductive element 118, FIG. 1) with first ends coupled to the input bondpad 342 of transistor die 340 and second ends coupled to bondpad 317 of IPD 310, integrated spiral inductor(s) 318-2 within IPD 310, and integrated capacitor(s) 322 within IPD 310. First terminals of the integrated spiral inductor(s) 318-2 are coupled to bondpad 317, and second terminals of the integrated spiral inductor(s) 312-2 are coupled to first terminal(s) of integrated capacitor(s) 322. Second terminal(s) of capacitor(s) 322 are coupled to a ground reference node (e.g., to flange 301). Essentially, the third set of bondwires 318-1, the bondpad 317, and the integrated spiral inductor(s) 318-2 correspond to inductance 118 (FIG. 1), and the integrated capacitor(s) 322 correspond to capacitance 122 (FIG. 1).

At this point, it may be noted that the LC circuit corresponding to part of inductance 118 and capacitance 122 in FIG. 1 are implemented, in the embodiment of FIG. 3, using multiple (in this case four) parallel LC circuits coupled between bondpad 317 and flange 301. The parallel LC circuit configuration is depicted also in the electrical equivalent circuit shown in the lower right corner of FIG. 3. As indicated in that electrical equivalent circuit with ellipses (" . . . "), more or fewer parallel LC circuits may be integrated within IPD 310 to provide the LC circuit corresponding to part of inductance 118 and capacitance 122 in FIG. 1.

In addition, it may be noted that the combination of bondwires 318-1, bondpad 317, and integrated spiral inductor(s) 318-2 that correspond to inductance 118 (FIG. 1) may take other forms. For example, when bondwires 318-1 alone are sufficient to provide the desired inductance 118 (FIG. 1), the integrated spiral inductor(s) 318-2 may be excluded from IPD 310, and bondpad 317 may be directly coupled to the first terminal(s) of integrated capacitor(s) 322.

According to the illustrated embodiment, portions of the harmonic termination circuit (e.g., circuit 130, FIG. 1) are embodied in a second IPD 330 that is coupled to the top surface of the flange 301 between the input lead 302 and the transistor die 340. More specifically, the portions of the harmonic termination circuit embodied within IPD 330 include a tank circuit 338 (e.g., tank circuit 138, FIG. 1) comprising a parallel combination of capacitor 333 (e.g., capacitance 133, FIG. 1) and inductor 337 (e.g., inductance 137, FIG. 1), where inductor 337 is coupled in series with DC blocking capacitor(s) 339 (e.g., capacitance 139, FIG. 1). Other portions of the harmonic termination circuit, and in particular other inductive portions, are implemented using sets of bondwires 331. Again, various conductive "nodes" are implemented with bondpads (e.g., bondpads 332, 335).

As discussed previously in conjunction with FIG. 1, according to an embodiment, the harmonic termination circuit includes a first inductance in the form of a first set of bondwires 331 (e.g., inductive element 131, FIG. 1) with first ends coupled to the input bondpad 342 of transistor die 340 (and thus to the input/control terminal of transistor 341) and second ends coupled to bondpad 332 of IPD 330 (corresponding to node 132, FIG. 1). The harmonic termination circuit also includes a tank circuit 338 (e.g., tank circuit 138, FIG. 1) coupled between bondpad 332 (corresponding to node 132, FIG. 1) and a ground reference node (e.g. flange 301). More specifically, the tank circuit 338 includes a capacitor 333 (e.g., capacitance 133, FIG. 1) of IPD 330 with a first terminal coupled to bondpad 332, and a second terminal coupled to the ground reference node (e.g., flange 301). In addition, the tank circuit 338 includes a shunt inductance, which is composed of a series arrangement of a fifth set of bondwires 337-1 (e.g., a portion of inductive element 137, FIG. 1), integrated spiral inductor(s) 337-2 within IPD 330 (e.g., another portion of inductive element 137, FIG. 1), and DC blocking capacitor(s) 339 (e.g., capacitance 139, FIG. 1). The bondwires of the fifth set of bondwires 337-1 have first ends coupled to bondpad 332 of IPD 330 and second ends coupled to bondpad 335 of IPD 330. First terminals of the integrated spiral inductor(s) 337-2 are coupled to bondpad 335, and second terminals of the integrated spiral inductor(s) 337-2 are coupled to first terminal(s) of integrated capacitor(s) 339. Second terminal(s) of capacitor(s) 339 are coupled to a ground reference node (e.g., to flange 301).

At this point, it may be noted that the LC circuit corresponding to part of inductance 137 and capacitance 139 in FIG. 1 are implemented, in the embodiment of FIG. 3, using multiple (in this case four) parallel LC circuits coupled between bondpad 335 and flange 301. The parallel LC circuit configuration is depicted also in the electrical equivalent circuit shown in the upper right corner of FIG. 3. As indicated in that electrical equivalent circuit with ellipses (" . . . "), more or fewer parallel LC circuits may be integrated within IPD 330 to provide the LC circuit corresponding to part of inductance 137 and capacitance 139 in FIG. 1.

As mentioned above, an alternate embodiment of the IPD 330 used to provide various components associated with the harmonic termination circuit (e.g., circuit 130, FIG. 1) may be implemented in the device 300, in another embodiment. More particularly, FIG. 4 is a top view of an IPD 430 that embodies portions of a harmonic frequency termination circuit, in accordance with another embodiment. Essentially, in FIG. 3, IPD 330 (including bondwires 337-1) may be replaced with IPD 430.

More specifically, according to an alternate embodiment, portions of the harmonic termination circuit (e.g., circuit 130, FIG. 1) are embodied in IPD 430 which may be coupled to the top surface of the flange (e.g., flange 301, FIG. 3) between the input lead 302 and the transistor die 340. The portions of the harmonic termination circuit embodied within IPD 430 include a tank circuit 438 (e.g., tank circuit 138, FIG. 1) comprising a parallel combination of shunt capacitor 433 (e.g., capacitance 133, FIG. 1) and inductor(s)

437 (e.g., inductance 137, FIG. 1) coupled in series with DC blocking capacitor(s) 439 (e.g., capacitance 139, FIG. 1).

The essential difference between IPD 330 and IPD 430 is that, in IPD 430, the first terminal of shunt capacitor 433 and the first terminal(s) of inductor(s) 437 are directly electrically coupled to bondpad 435, rather than being coupled through a set of bondwires (e.g., bondwires 337-1, FIG. 3).

As mentioned above, device 300 embodies a single amplification path between input and output leads 302, 304. When incorporated into a multiple-path amplifier, such as the Doherty amplifier 500 described below in conjunction with FIG. 5, the amplification path embodied in device 300 may correspond to a main amplifier path (e.g., main amplifier path 520, FIG. 5), or the amplification path may correspond to a peaking amplifier path (e.g., peaking amplifier path 521, FIG. 5). Accordingly, two instances of device 300 may be utilized to provide both the main and peaking amplifier paths, although some of the individual components may have differences (e.g., the power transistor in the peaking amplifier path may be larger than the power transistor in the main amplifier path). In an alternate embodiment, device 300 could be modified to include two amplification paths implemented in parallel within the same package (e.g., the device could include two input leads, two output leads, and two instances of the circuitry depicted in FIG. 3), in order to be more efficiently utilized in a multiple-path amplifier.

Figure 5:
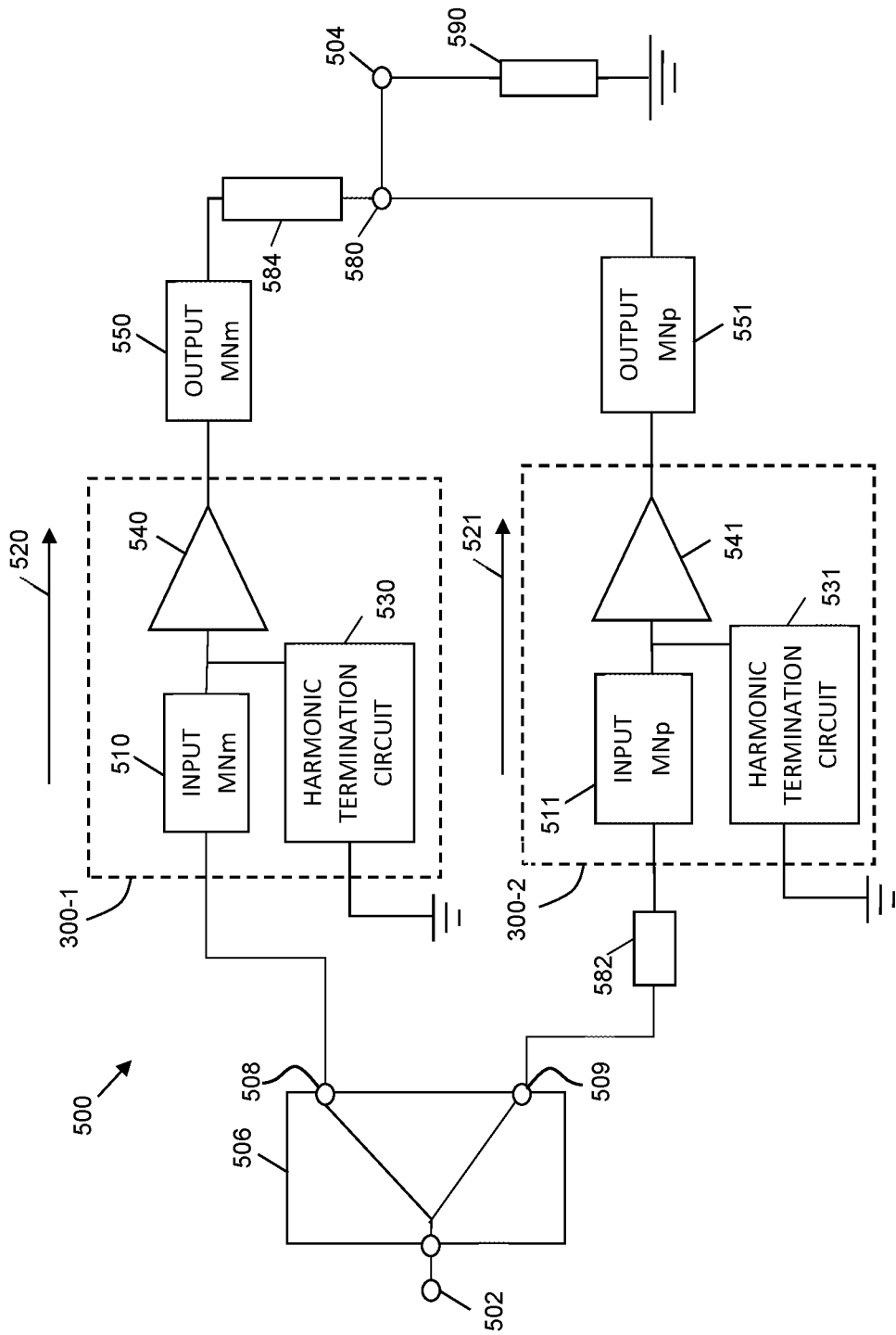
FIG. 5 is a simplified schematic diagram of a Doherty power amplifier, in accordance with an example embodiment.

For example, FIG. 5 is a simplified schematic diagram of a Doherty power amplifier 500 in which two parallel instances of RF power amplifier circuit 100 may be implemented. Amplifier 500 includes an input node 502, an output node 504, a power divider 506 (or splitter), a main amplifier path 520, a peaking amplifier path 521, and a combining node 580. A load 590 may be coupled to the combining node 580 (e.g., through an impedance transformer, not shown) to receive an amplified RF signal from amplifier 500.

Power divider 506 is configured to divide the power of an input RF signal received at input node 502 into main and peaking portions of the input signal. The main input signal is provided to the main amplifier path 520 at power divider output 508, and the peaking input signal is provided to the peaking amplifier path 521 at power divider output 509. During operation in a full-power mode when both the main and peaking amplifiers 540, 541 are supplying current to the load 590, the power divider 506 divides the input signal power between the amplifier paths 520, 521. For example, the power divider 506 may divide the power equally, such that roughly one half of the input signal power is provided to each path 520, 521 (e.g., for a symmetric Doherty amplifier configuration). Alternatively, the power divider 506 may divide the power unequally (e.g., for an asymmetric Doherty amplifier configuration).

Essentially, the power divider 506 divides an input RF signal supplied at the input node 502, and the divided signals are separately amplified along the main and peaking amplifier paths 520, 521. The amplified signals are then combined in phase at the combining node 580. It is important that phase coherency between the main and peaking amplifier paths 520, 521 is maintained across a frequency band of interest to ensure that the amplified main and peaking signals arrive in phase at the combining node 580, and thus to ensure proper Doherty amplifier operation.

Each of the main amplifier 540 and the peaking amplifier 541 includes one or more single-stage or multiple-stage power transistor dies (e.g., die 340, FIG. 3) for amplifying an RF signal conducted through the amplifier 540, 541. According to various embodiments, all amplifier stages or a final amplifier stage of either or both the main amplifier 540 and/or the peaking amplifier 541 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 540 or the peaking amplifier 541 is implemented as a III-V FET, the other amplifier may be implemented as a silicon-based FET (e.g., an LDMOS FET), in some embodiments.

Although the main and peaking power transistor dies may be of equal size (e.g., in a symmetric Doherty configuration), the main and peaking power transistor dies may have unequal sizes, as well (e.g., in various asymmetric Doherty configurations). In an asymmetric Doherty configuration, the peaking power transistor die typically is larger than the main power transistor die by some multiplier. For example, the peaking power transistor die may be twice the size of the main power transistor die so that the peaking power transistor die has twice the current-carrying capability of the main power transistor die. Peaking-to-main amplifier die size ratios other than a 2:1 ratio may be implemented, as well.

During operation of Doherty amplifier 500, the main amplifier 540 is biased to operate in class AB mode, and the peaking amplifier 541 is biased to operate in class C mode. At low power levels, where the power of the input signal at node 502 is lower than the turn-on threshold level of peaking amplifier 541, the amplifier 500 operates in a low-power (or back-off) mode in which the main amplifier 540 is the only amplifier supplying current to the load 590. When the power of the input signal exceeds a threshold level of the peaking amplifier 541, the amplifier 500 operates in a high-power mode in which the main amplifier 540 and the peaking amplifier 541 both supply current to the load 590. At this point, the peaking amplifier 541 provides active load modulation at combining node 580, allowing the current of the main amplifier 540 to continue to increase linearly.

Input and output impedance matching networks 510, 550 (input MNm, output MNm) may be implemented at the input and/or output of the main amplifier 540. Similarly, input and output impedance matching networks 511, 551 (input MNp, output MNp) may be implemented at the input and/or output of the peaking amplifier 541. In each case, the matching networks 510, 511, 550, 551 may be used to transform the gate and drain impedances of main amplifier 540 and peaking amplifier 541 to a more desirable system level impedance, as well as manipulate the signal phases to ensure proper Doherty amplifier operation. All or portions of the input and output impedance matching networks 510, 511, 550, 551 may be implemented inside a power transistor package that includes the main and/or peaking amplifiers 540, 541, or some portions of the input and output impedance matching networks 510, 511, 550, 551 may be implemented on a PCB or other substrate to which a power transistor package is mounted. According to an embodiment, each of the input impedance matching networks 510, 511 may have the same or similar configuration as the fundamental matching circuits (e.g., circuit 110, FIG. 1) described above.

In addition, embodiments of the inventive subject matter include harmonic frequency termination circuits 530, 531 (e.g., instances of harmonic termination circuit 130, FIG. 1) coupled between the inputs of amplifiers 540, 541 and a ground reference node. The harmonic termination circuits 530, 531 are configured to control the harmonic impedance across a relatively wide fractional bandwidth. For example, the harmonic termination circuits 530, 531 may provide a low impedance path to ground for signal energy at the second harmonic of the fundamental frequency of operation of the amplifier 500.

As indicated in FIG. 5 with dashed-line boxes 300-1, 300-2, the input matching circuit 510, amplifier 540, and harmonic termination circuit 530 for the main amplification path 520 may be implemented using a first instance of device 300, and the input matching circuit 511, amplifier 541, and harmonic termination circuit 531 for the peaking amplification path 521 may be implemented using a second instance of device 300. In an alternate embodiment, and as discussed previously, the above-listed components for the main and peaking amplification paths may be combined into a single package body.

Doherty amplifier 500 has a "non-inverted" load network configuration. In the non-inverted configuration, the input circuit is configured so that an input signal supplied to the peaking amplifier 541 is delayed by 90 degrees with respect to the input signal supplied to the main amplifier 540 at the fundamental frequency of operation of the amplifier 500. To ensure that the main and peaking input RF signals arrive at the main and peaking amplifiers 540, 541 with about 90 degrees of phase difference, as is fundamental to proper Doherty amplifier operation, phase delay element 582 applies about 90 degrees of phase delay to the peaking input signal. For example, phase delay element 582 may include a quarter wave transmission line, or another suitable type of delay element with an electrical length of about 90 degrees.

To compensate for the resulting 90 degree phase delay difference between the main and peaking amplifier paths 520, 521 at the inputs of amplifiers 540, 541 (i.e., to ensure that the amplified signals arrive in phase at the combining node 580), the output circuit is configured to apply about a 90 degree phase delay to the signal between the output of main amplifier 540 and the combining node 580. This is achieved through an additional delay element 584. Alternate embodiments of Doherty amplifiers may have an "inverted" load network configuration. In such a configuration, the input circuit is configured so that an input signal supplied to the main amplifier 540 is delayed by about 90 degrees with respect to the input signal supplied to the peaking amplifier 541 at the center frequency of operation of the amplifier 500, and the output circuit is configured to apply about a 90 degree phase delay to the signal between the output of peaking amplifier 541 and the combining node 580.

Figure 6:
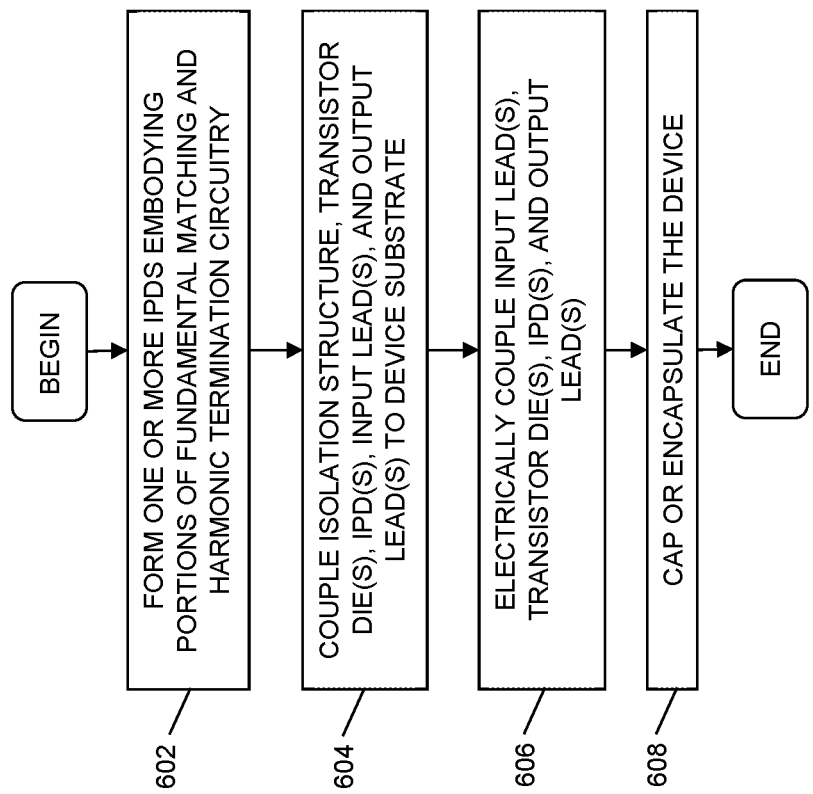
FIG. 6 is a flowchart of a method for fabricating a packaged RF power amplifier device that includes an embodiment of a harmonic frequency termination circuit, in accordance with an example embodiment.

FIG. 6 is a flowchart of a method for fabricating a packaged RF power amplifier device (e.g., device 300, FIG. 3) that includes embodiments of fundamental matching circuits and harmonic termination circuits (e.g., circuits 110, 130, FIG. 1), in accordance with various example embodiments. The method may begin, in blocks 602, by forming one or more IPDs. More specifically, in block 602, one or more input IPDs (e.g., IPD 310, 330, 430, FIGS. 3, 4) may be formed. According to an embodiment, a first input IPD (e.g., IPD 310, FIG. 3) includes components of a fundamental matching circuit, and a second input IPD (e.g., IPD 330, 430, FIGS. 3, 4) includes components of a harmonic termination circuit. For example, the first input IPD (e.g., IPD 310, FIG. 3) may include one or more integrated capacitors (e.g., capacitors 314, 322, FIG. 3), and one or more inductive elements (e.g., inductive elements 318-2, FIG. 3). The second input IPD (e.g., IPD 330 or 430, FIGS. 3, 4) may include one or more integrated capacitors (e.g., capacitors 333, 339, 433, 439, FIGS. 3, 4). In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes at a surface of each IPD substrate. As discussed previously, the connection nodes may include conductive bond pads (e.g., bond pads 315, 317, 332, 335, 435, FIGS. 3, 4), which may accept attachment of inductive elements (e.g., bondwires 312, 316, 318-1, 331, 337-1, FIGS. 3, 4). In addition, in block 602, when some components corresponding to various circuit elements (e.g., bondwires 337-1, FIG. 3) are implemented as non-integrated components, those discrete components may be coupled to conductors exposed at the surface of an IPD to form an IPD assembly. For example, referring again to FIG. 3, bondwires 337-1 may be coupled between bond pads 332 and 335 of IPD 310, in some embodiments.

In block 604, for an air cavity embodiment, an isolation structure is coupled to a device substrate (e.g., flange 301, FIG. 3). In addition, one or more active devices (e.g., transistor die 340, FIG. 3) and IPD assemblies (e.g., IPDs or IPD assemblies 310, 330, 430, FIGS. 3, 4) are coupled to a portion of the top surface of the substrate that is exposed through an opening in the isolation structure. Leads (e.g., input and output leads 302, 304, FIG. 3) are coupled to the top surface of the isolation structure. For overmolded (e.g., encapsulated) device embodiments, the isolation structure may be excluded, and the substrate and leads may form portions of a leadframe.

In block 706, the input lead(s), transistor(s), IPD assembly(ies), and output lead(s) are electrically coupled together. For example, the electrical connections may be made using bondwires between the various device components and elements, as discussed previously. Some of the bondwires correspond to inductive components of input matching circuits (e.g., bondwires 312, 316, 318-1, FIG. 3), and harmonic termination circuits (e.g., bondwires 331, 337-1, FIGS. 3, 4), for example. Finally, in block 608, the device is capped (e.g., for an air cavity package) or encapsulated (e.g., with mold compound for an overmolded package). The device may then be incorporated into a larger electrical system (e.g., a Doherty amplifier or other type of electrical system).

An embodiment of an RF amplifier includes an amplifier input, a transistor die with a transistor and a transistor input terminal, a fundamental frequency impedance matching circuit coupled between the amplifier input and the transistor input terminal, and a harmonic frequency termination circuit coupled between the transistor input terminal and a ground reference node. The harmonic frequency termination circuit includes a first inductance coupled between the transistor input terminal and a first node, and a tank circuit coupled between the first node and the ground reference node. The tank circuit includes a first capacitance coupled between the first node and the ground reference node, and a second inductance coupled between the first node and the ground reference node.

According to a further embodiment, the tank circuit is configured to shunt signal energy at or near a second harmonic frequency, while appearing as an open circuit to signal energy at a fundamental frequency of operation of the RF amplifier.

According to yet another further embodiment, the tank circuit is configured to function as a high impedance path to ground for signal energy at a fundamental frequency of operation of the RF amplifier, and a low impedance path to ground for signal energy at or near a second harmonic frequency.

An embodiment of a packaged RF amplifier device includes a device substrate, an input lead coupled to the device substrate, and a transistor die coupled to the device substrate, which includes a transistor with a transistor input terminal. The device further includes a fundamental frequency impedance matching circuit coupled between the input lead and the transistor input terminal, and a harmonic frequency termination circuit coupled between the transistor input terminal and a ground reference node. The harmonic frequency termination circuit includes a first inductance coupled between the transistor input terminal and a first node, and a tank circuit coupled between the first node and the ground reference node. The tank circuit comprises a first capacitance coupled between the first node and the ground reference node, and a second inductance coupled between the first node and the ground reference node.

An embodiment of a method of manufacturing an RF amplifier device includes coupling a transistor die to a device substrate between an input lead and an output lead, where the transistor die includes a transistor and a transistor input terminal. The method further includes coupling a fundamental frequency impedance matching circuit between the input lead and the transistor input terminal, and coupling a harmonic frequency termination circuit between the transistor input terminal and a ground reference node. The harmonic frequency termination circuit includes a first inductance coupled between the transistor input terminal and a first node, and a tank circuit coupled between the first node and the ground reference node. The tank circuit includes a first capacitance coupled between the first node and the ground reference node, and a second inductance coupled between the first node and the ground reference node.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier comprising:
   an amplifier input;
   a transistor die with a transistor and a transistor input terminal;
   a fundamental frequency impedance matching circuit coupled between the amplifier input and the transistor input terminal, wherein the fundamental frequency impedance matching circuit includes a first inductance with a first terminal coupled to the amplifier input, and a second terminal directly connected to the transistor input terminal; and
   a harmonic frequency termination circuit coupled between the transistor input terminal and a ground reference node, wherein the harmonic frequency termination circuit includes a second inductance with a first terminal directly connected to the transistor input terminal and a second terminal coupled to a first node, and a tank circuit coupled between the first node and the ground reference node, wherein the tank circuit comprises a first capacitance coupled between the first node and the ground reference node, and a third inductance coupled between the first node and the ground reference node.

2. The RF amplifier of claim 1, wherein the tank circuit is configured to shunt signal energy at or near a second harmonic frequency, while appearing as an open circuit to signal energy at a fundamental frequency of operation of the RF amplifier.

3. The RF amplifier of claim 1, wherein the tank circuit is configured to function as a high impedance path to ground for signal energy at a fundamental frequency of operation of the RF amplifier, and a low impedance path to ground for signal energy at or near a second harmonic frequency.

4. A radio frequency (RF) amplifier comprising:
   an amplifier input;
   a transistor die with a transistor and a transistor input terminal;
   a harmonic frequency termination circuit coupled between the transistor input terminal and a ground reference node, wherein the harmonic frequency termination circuit includes a first inductance coupled between the transistor input terminal and a first node, and a tank circuit coupled between the first node and the ground reference node, wherein the tank circuit comprises a first capacitance coupled between the first node and the ground reference node, and a second inductance coupled between the first node and the ground reference node; and a fundamental frequency impedance matching circuit coupled between the amplifier input and the transistor input terminal, wherein the fundamental frequency impedance matching circuit includes a third inductance coupled between the amplifier input and a second node, a fourth inductance coupled between the second node and the transistor input terminal, a second capacitance coupled between the second node and the ground reference terminal, and a fifth inductance coupled between the transistor input terminal and the ground reference node.

5. The RF amplifier of claim 4, further comprising:
a third capacitance coupled in series with the fifth inductance between the transistor input terminal and the ground reference node.

6. The RF amplifier of claim 1, further comprising:
a first DC blocking capacitor coupled in series with the third inductance between the first node and the ground reference node.

7. The RF amplifier of claim 1, wherein the transistor has a nonlinear input capacitance.

8. The RF amplifier of claim 7, wherein the transistor is a gallium nitride transistor.

9. A packaged radio frequency (RF) amplifier device comprising:
a device substrate;
an input lead coupled to the device substrate;
a transistor die coupled to the device substrate, wherein the transistor die includes a transistor with a transistor input terminal;
a fundamental frequency impedance matching circuit coupled between the input lead and the transistor input terminal;
a harmonic frequency termination circuit coupled between the transistor input terminal and a ground reference node, wherein the harmonic frequency termination circuit includes a first inductance coupled between the transistor input terminal and a first node, and a tank circuit coupled between the first node and the ground reference node, wherein the tank circuit comprises a first capacitance coupled between the first node and the ground reference node, and a second inductance coupled between the first node and the ground reference node; and
a first integrated passive device coupled to the device substrate, wherein the first integrated passive device comprises a first bondpad corresponding to the first node, and the first capacitance and the second inductance are integrally formed within the first integrated passive device and electrically coupled in parallel between the first bondpad and the ground reference node.

10. The packaged RF amplifier device of claim 9, wherein the first inductance comprises a first set of bondwires coupled between the transistor input terminal and the first bondpad.

11. The packaged RF amplifier device of claim 9, wherein:
the first integrated passive device further includes a second bondpad; and the harmonic frequency termination circuit further includes a third inductance coupled between the first bondpad and the second bondpad.

12. The packaged RF amplifier device of claim 9, further comprising:
a first DC blocking capacitor coupled in series with the second inductance between the first node and the ground reference node.

13. The packaged RF amplifier device of claim 9, wherein the fundamental frequency impedance matching circuit comprises:
a third inductance coupled between the input lead and a second node;
a fourth inductance coupled between the second node and the transistor input terminal;
a second capacitance coupled between the second node and the ground reference terminal;
a fifth inductance coupled between the transistor input terminal and the ground reference node; and
a third capacitance coupled in series with the fifth inductance between the transistor input terminal and the ground reference node.

14. The packaged RF amplifier device of claim 13, further comprising:
a second integrated passive device coupled to the device substrate, wherein the second integrated passive device comprises a second bondpad corresponding to the second node, and the second capacitance and the third capacitance are integrally formed within the second integrated passive device.

15. A method of manufacturing an RF amplifier device, the method comprising the steps of:
coupling a transistor die to a device substrate between an input lead and an output lead, wherein the transistor die includes a transistor and a transistor input terminal;
coupling a fundamental frequency impedance matching circuit between the input lead and the transistor input terminal, wherein the fundamental frequency impedance matching circuit includes a first inductance with a first terminal and a second terminal, and coupling the fundamental frequency impedance matching circuit includes coupling the first terminal of the first inductance to the amplifier input, and directly connecting the second terminal of the first inductance to the transistor input terminal; and
coupling a harmonic frequency termination circuit between the transistor input terminal and a ground reference node, wherein the harmonic frequency termination circuit includes a second, a third inductance, and a first capacitance, and wherein coupling the harmonic frequency termination circuit includes directly connecting a first terminal of the second inductance to the transistor input terminal, coupling a second terminal of the second inductance to a first node, and coupling a tank circuit between the first node and the ground reference node, wherein the tank circuit comprises the first capacitance coupled between the first node and the ground reference node, and the third inductance coupled between the first node and the ground reference node.

16. A method of manufacturing an RF amplifier device, the method comprising the steps of:
coupling a transistor die to a device substrate between an input lead and an output lead, wherein the transistor die includes a transistor and a transistor input terminal;

coupling a fundamental frequency impedance matching circuit between the input lead and the transistor input terminal; and coupling a harmonic frequency termination circuit between the transistor input terminal and a ground reference node, wherein the harmonic frequency termination circuit includes a first inductance coupled between the transistor input terminal and a first node, and a tank circuit coupled between the first node and the ground reference node, wherein the tank circuit comprises a first capacitance coupled between the first node and the ground reference node, and a second inductance coupled between the first node and the ground reference node, wherein coupling the harmonic frequency termination circuit between the transistor input terminal and the ground reference node includes coupling an integrated passive device to the device substrate between the input lead and the transistor die, wherein the integrated passive device includes comprises a first bondpad corresponding to the first node, and the first capacitance and the second inductance are integrally formed within the integrated passive device and electrically coupled in parallel between the first bondpad and the ground reference node, and coupling a set of bondwires corresponding to the first inductance between the transistor input terminal and the first bondpad.

17. The RF amplifier of claim 1, wherein the second inductance and the first capacitance are configured to resonate at or near a second harmonic of a fundamental frequency of operation of the RF amplifier.

18. The RF amplifier of claim 4, wherein the second inductance and the first capacitance are configured to resonate at or near a second harmonic of a fundamental frequency of operation of the RF amplifier.

19. The packaged RF amplifier device of claim 9, wherein the second inductance and the first capacitance are configured to resonate at or near a second harmonic of a fundamental frequency of operation of the RF amplifier.

* * * * *